(12) United States Patent
Lin et al.

(10) Patent No.: US 6,509,754 B2
(45) Date of Patent: Jan. 21, 2003

(54) CPU ADAPTER FOR A MOTHERBOARD TEST MACHINE

(75) Inventors: Gen-Ki Lin, Ilan (TW); Chao-Ching Chang, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 0 days.

(21) Appl. No.: 09/887,326

(22) Filed: Jun. 25, 2001

(65) Prior Publication Data

US 2002/0000816 A1 Jan. 3, 2002

(30) Foreign Application Priority Data

Jun. 29, 2000 (TW) ........................................ 089211178

(51) Int. Cl.⁷ .............................................. G01R 31/02
(52) U.S. Cl. ........................ 324/755; 324/751; 324/754; 324/757; 324/758
(58) Field of Search ................................ 324/458.1, 73, 324/754, 755, 761, 758, 437, 445, 690, 696, 715, 757; 439/428, 169, 219, 482; 702/91, 168; 338/229

(56) References Cited

U.S. PATENT DOCUMENTS

| | | | | |
|---|---|---|---|---|
| 5,270,641 A | * | 12/1993 | Van Loan | 324/158.1 |
| 5,572,144 A | * | 11/1996 | Davidson | 324/158.1 |
| 5,894,225 A | * | 4/1999 | Coffin | 324/761 |
| 6,294,908 B1 | * | 9/2001 | Belmore | 324/158.1 |

* cited by examiner

*Primary Examiner*—Kamand Cuneo
*Assistant Examiner*—Trung Nguyen
(74) *Attorney, Agent, or Firm*—Rabin & Berdo, P.C.

(57) ABSTRACT

A CPU adapter is installed in a test machine for testing motherboards. The CPU adapter is capable of couping a CPU and a motherboard while testing. The circuit design of the CPU adapter can enhance the signals of the CPU and widen the clock signal thereof. The signals of the CPU can be transmitted to the motherboard to be tested correctly. Instead of insertion and removal of the CPU manually, it can thus accelerate the testing speed, lower the hazard of damaging the computer component, and decrease the demand for test tools.

15 Claims, 3 Drawing Sheets

CPU ADAPTER FOR A MOTHERBOARD TEST MACHINE

BACKGROUND OF THE INVENTION

This application incorporates by reference Taiwan patent application Serial No. 89211178, Filed on Jun. 29, 2000.

1. Field of the Invention

The invention relates in general to an adapter for a computer component of a motherboard test machine, and more particularly to a CPU adapter of the motherboard test machine.

2. Description of the Related Art

The Computer has become widely used in modern life. The demand for computers is increasing nowadays due to their diversity and various applications. The objective is to provide users with high quality products. Hence, quality control and tests for products play important roles in mass production.

Most manufacturers use test machines to test their newly produced components or devices. Take the motherboard for example. The motherboard is first placed on the test machine and linked to the computer components, such as peripheral equipment, apparatus, an interface card and so forth. Then the test machine starts up and detects the motherboard circuitry. The period of the testing directly influences the time for product production. Analyzing the forgoing test procedures, it takes a lot of time to insert and remove the peripheral equipment, apparatus, interface card, and so forth. Those steps, as described above, are carried through by manpower. It wastes time to assemble the test machine whenever preparing to test a motherboard. It might cause the connecting pins to become crooked and even snapped due to the negligence and frequent insertion and removal of the computer components. Therefore, using probes to connect the computer components can reduce the manpower, improve the testing efficiency and lower the component consumption rate.

Conventionally, a test machine includes a function test box, a carrier and a shingle. A probe load board upon the function test box has a number of probes on its surface. The carrier, which is disposed above the function test box and has a number of guide holes, is capable of carrying a motherboard to be tested. The locations of the guide holes, the probes, and pins on the bottom of the motherboard to be tested are interrelated. While the carrier moves downward, the probes are inserted into the guide holes exactly and connect to the pins of the motherboard to be tested. The shingle is disposed above the carrier and has a number of presser bar members or press sticks on its bottom surface wherein the press sticks are capable of fixing the motherboard to be tested on the carrier. Before testing, the computer components, such as the peripheral equipment, apparatus, and interface card, are assembled in the function test box beforehand. The function test box then couples the pins of those components to the probes on the probe load board.

In the beginning of the testing, the motherboard to be tested is placed on the carrier, and the shingle and the carrier are moved downward. The probes then move into the guide holes of the carrier exactly and are coupled to the pins on the bottom surface of the motherboard to be tested. Thereafter, the test machine proceeds to test electronically. After finishing the test, the shingle and the carrier are uplifted and another motherboard to be tested is substituted in the next test. It improves the speed of testing by utilizing the probes as compared to working by human labor to insert and remove the computer components.

However, utilizing the probes to connect the motherboard to be tested and the apparatus is suitable for low-frequency apparatus, such as the disk drive, keyboard, mouse and so on. If the computer component is high frequency, such as the Central Processing Unit (CPU), graphic card, Random Access Memory (RAM), it might cause two problems, which are as follows:

First, the high-frequency signals are prone to diminish due to the impedance of the probes.

Second, the high-frequency signals are prone to cause timing disorders due to improper matching with the impedance of the probes.

Therefore, the CPU (or other high-frequency apparatus) still has to be inserted and removed by manpower. It is not only time-consuming but also damaging to the pins of the CPU (or other high-frequency apparatus) and thus increases the cost of manufacture.

SUMMARY OF THE INVENTION

It is therefore an object of the invention to provide a CPU adapter for a motherboard test machine. The CPU is plugged in a socket of the device. A connection board of the device is coupled to the pins of the Printed Circuit Board (PCB) to be tested. It can prevent the signals of the CPU from diminishing by means of the circuit design of the connection board and keep the timing regular. Thus, it can save time that would otherwise be needed to insert and remove the apparatus by manpower, lower the hazard of damaging the computer component and decrease the demand for test tools, such as the CPU.

The invention achieves the above-identified objects by providing a CPU adapter installed in a test machine for a motherboard to be tested. The CPU adapter includes a connection board and a number of probes wherein the connection board is combined with a CPU and capable of widening the clock signal of the CPU by a widening clock circuit. The probes, disposed on and coupled to the connection board, are capable of being coupled to the pins of the motherboard to be tested. The CPU adapter further includes a number of probe-receptacles and a mounting board. The probe-receptacles are disposed on and coupled to the connection board, with the probes being inserted therein. The mounting board and the connection board are capable of fixing the probe-receptacles for not slanting.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
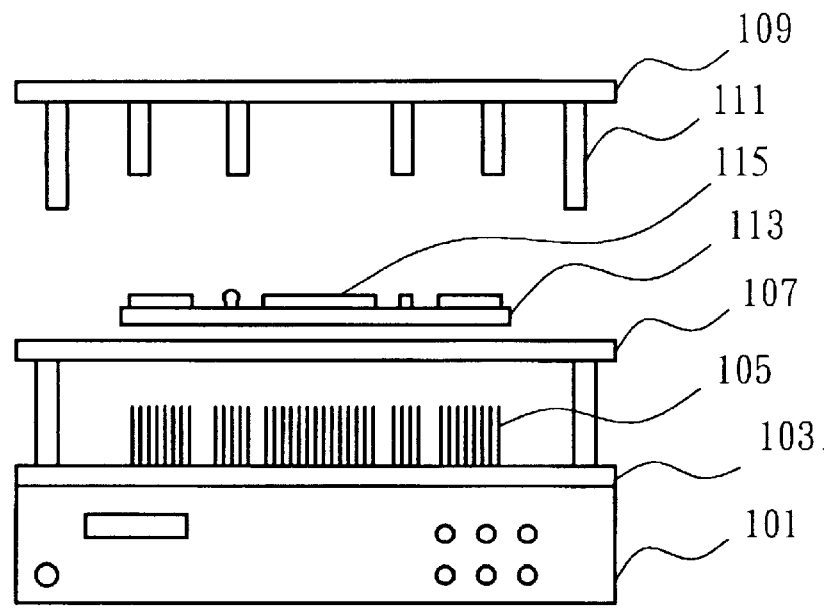
FIG. 1 shows a front view of a motherboard test machine.

Referring first to FIG. 1, a front view of a motherboard test machine is illustrated. As shown in FIG. 1, a carrier 107 and a shingle 109—are disposed over a function test box 101 of the test machine and are movable up and down. The presser bar members or press sticks 111 underneath the shingle 109 can fix the motherboard to be tested 113 while the shingle 109 moves downward to a fixed or held position. The carrier 107 is capable of carrying the motherboard to be tested 113 and has guide holes (not shown in the FIGS.) located opposite to the pins on the bottom surface of the motherboard to be tested 103. A probe load board 103 on the function test box 101 has probes 105 located opposite to the guide holes on the carrier 107. While the carrier moves downward, the probes 105 are inserted into the guide holes of the carrier 107 exactly and are coupled to the pins of the motherboard to be tested 113. Before testing, the computer components, such as the peripheral equipment, apparatus, and an interface card (not shown in the FIGS.), are assembled in the function test box 101 beforehand. The function test box 101 then couples the pins of those components to the probes 105 on the probe load board 103.

Figure 2:
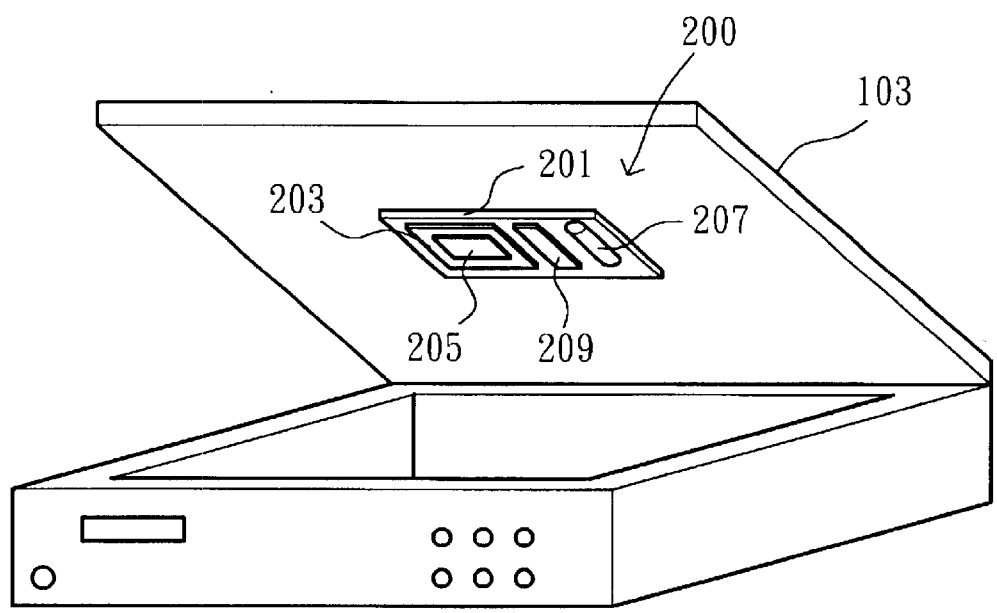
FIG. 2 illustrates a perspective view of a test machine shown in FIG. 1.
Figure 3:
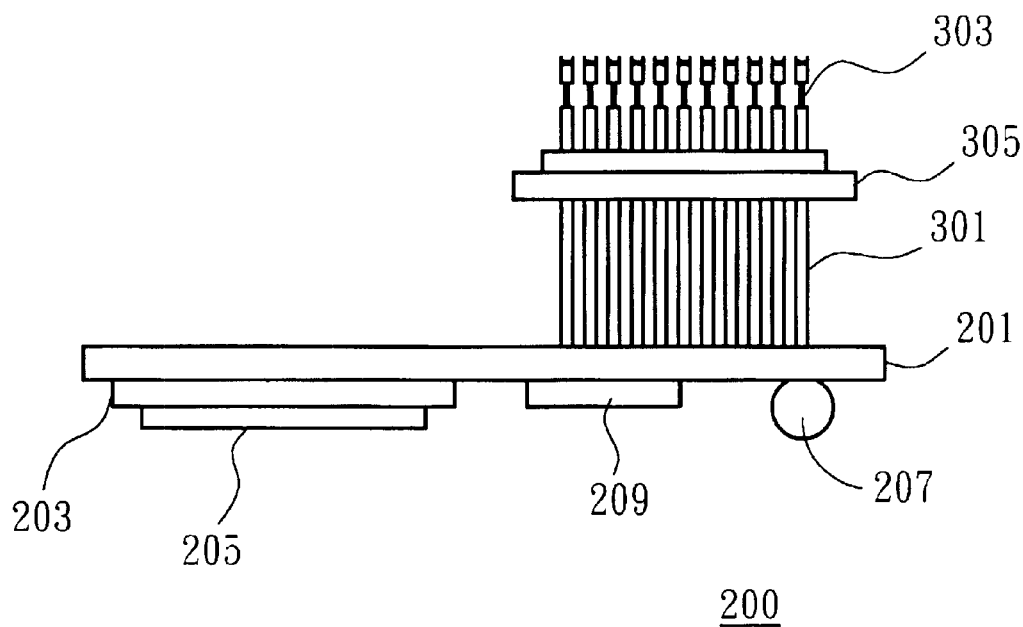
FIG. 3 illustrates a front view of the structure of a CPU adapter of a motherboard test machine according to a preferred embodiment of this invention shown in FIG. 2.

Please refer to FIG. 2 for the plug-in location of the CPU. A perspective view of the test machine shown in FIG. 1 is illustrated in FIG. 2. As shown in FIG. 2, a CPU adapter 200 on the bottom surface of the probe load board 103 is capable of coupling a CPU 205 and the motherboard to be tested 113. Please also refer to FIG. 3. A front view of the structure of a CPU adapter of a motherboard test machine according to a preferred embodiment of this invention shown in FIG. 2 is illustrated in FIG. 3. The CPU adapter 200 includes a connection board 201, a number of probe-receptacles 301 and a number of probes wherein the connection board 201 includes a socket 203 for connecting to the CPU 205. The probe-receptacles 301 are on the connection board 201 and the probes insert within them. The probes 303 are capable of connecting to the pins of the bottom surface of the motherboard to be tested 113 and are coupled to the probe-receptacles 301 and the connection board 201. The CPU adapter 200 further includes a mounting board 305 for fixing the probe-receptacles wherein the probe-receptacles 301 can pierce though the mounting board 305. By this way, the probes 303 can be coupled to the pins of the motherboard to be tested 113 precisely.

Since the CPU 205 is coupled to the pins of the motherboard to be tested 113, it might cause the signals to diminish and the timing to become disordered, and make the system malfunction. Thus, the circuit design on the connection board 201 is used for improving the above-mentioned defects. The connection board 201 further includes an electrolytic capacitor 207 and a clock widen circuit 209. The electrolytic capacitor is provided for enhancing the signals of the CPU 205. And the connection board 201 widens the clock signal of the CPU 205 by using the clock widen circuit. Hence, the signals of the CPU 205 can keep the signals and timing regular.

Figure 4:
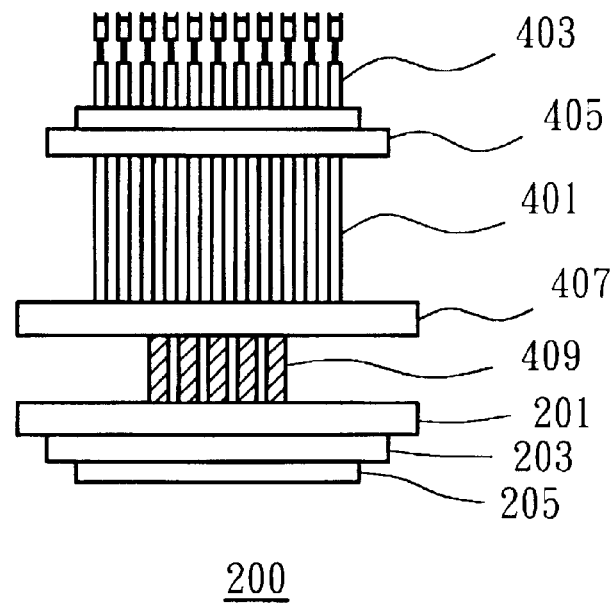
FIG. 4 illustrates a front view of the structure of a CPU adapter of a motherboard test machine according to another preferred embodiment of this invention shown in FIG. 2.

Moreover, considering that the CPU adapter in FIG. 3 occupies more space than the CPU adapter in FIG. 4. A front view of the structure of a CPU adapter of a motherboard test machine according to another preferred embodiment of this invention shown in FIG. 2 is illustrated in FIG. 4. The CPU adapter 200 includes a connecting board 201, a number of probe-receptacles 401, a number of probes, a socket 203, and a mounting board 405. The circuit design and the connecting correlation thereof are as mentioned above except that the location of the probes 403 is directly opposite to that of the pins of the CPU 205 for the sake of saving the space. In order to prevent the probe-receptacles 401 from conflicting with the pins of CPU 205, the CPU adapter 200 further includes a connection board 407 and a number of probes 409. The connection board 407 for connecting with the probe-receptacles 401 is coupled to the connection board 201 by the probes. The location of the probes 409 should avoid conflict with the pins of the socket 203.

Figure 5:
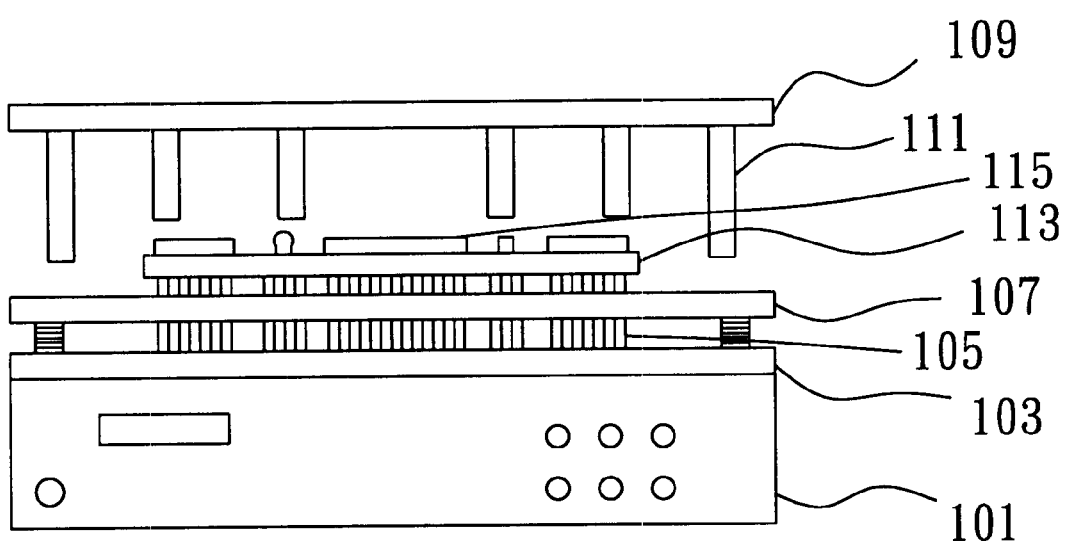
FIG. 5 illustrates a front view of a motherboard to be tested disposed in the fixed position for testing shown in FIG. 1.

Referring to FIG. 5, a front view of a motherboard to be tested disposed in the fixed position for testing shown in FIG. 1 is illustrated. After the motherboard to be tested 113 is placed in position, the shingle 109 and carrier 107 move downward and arrive the fixed position for testing. The probes 105 of the CPU adapter 200 move into the guide holes of the carrier 107 exactly and connect to the corresponding pins on the bottom surface of the motherboard to be tested 113. Thereafter, the test machine proceeds to test the circuitry. After finishing the test, the shingle 109 and the carrier 107 are uplifted and another motherboard to be tested is substituted in the next test.

In accordance with the above-mentioned preferred embodiment of the invention, the adapter may be used not only for a CPU but also for any other high-frequency components, such as graphic cards, RAM, and so on.

The advantages of the CPU adapter of the motherboard test machine according to the disclosed embodiment are as follows:

First, it shortens the test time and raises the producing rate: the CPU is plugged in the connection board of the CPU adapter in the function test box beforehand. Instead of insertion and removal of the CPU by manpower, the PCB to be tested is put in the function test box and the circuit testing proceeds.

Second, it decreases the cost of testing: The connecting pins of the CPU used to get bent and even snap due to the worker negligence and frequent insertion and removal of the computer components. The damage to the component increases the cost of testing. By way of using probes to connect the computer components according to this invention, it can lower the hazard of damaging the computer component and further decrease the component consumption rate and the cost of testing.

Third, it decreases the demand for test tools, such as CPUs. It requires one CPU for one test machine instead of plugging one CPU in each motherboard to be tested. Therefore, it decreases the amount of test tools for usage.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An adapter for a high-frequency component, the adapter being installed in a test machine for testing a Printed Circuit Board (PCB), the adapter comprising:

a connection board on which the high-frequency component is mounted, a clock widening circuit for widening a clock signal of the high-frequency component additionally being mounted on the connection board; and a plurality of probes disposed on and coupled to the connection board, the probes being capable of being coupled to the pins of the PCB to be tested.

2. The adapter according to claim 1, wherein the adapter further comprises a plurality of probe-receptacles, disposed on the connection board and the probes inserted therein, coupling the probes to the connection board.

3. The adapter according to claim 2, wherein the adapter further comprises a mounting board over the connection board, capable of fixing the probe-receptacles.

4. The adapter according to claim 1, wherein the connection board has a socket for connecting the high-frequency component.

5. The adapter according to claim 1, wherein the high-frequency component is a Central Processing Unit (CPU).

6. The adapter according to claim 5, wherein an electrolytic capacitor is additionally mounted on the connection board to enhance the signals of the CPU.

7. The adapter according to claim 1, wherein the high-frequency component is a graphic card.

8. The adapter according to claim 1, wherein the high-frequency component is a Random Access Memory (RAM).

9. A test machine for testing a Printed Circuit Board (PCB) with an exterior high-frequency component, the test machine comprising:
   a carrier for carrying the PCB to be tested, having a plurality of guide holes located opposite to pins on the bottom surface of the PCB to be tested;
   a function test box under the carrier, wherein a probe load board is disposed on the function test box, and the probe load board includes
      a plurality of probes on the top surface, located opposite to the guide holes, the probes being capable of moving into the guide holes and coupling to the pins of the PCB to be tested, and
      a connection board on the bottom surface of the probe load board, the high-frequency component being mounted on the connection board and coupled to the probes, a clock widening circuit additionally being mounted on the connection board for widening a clock signal of the high-frequency component; and
   a shingle above the carrier, capable of coupling the PCB to be tested to the probes.

10. The test machine according to claim 9, wherein the connection board has a socket for connecting the high-frequency component.

11. The test machine according to claim 9, wherein the shingle comprises a plurality of presser bar members for fixing the PCB to be tested on the carrier and coupling the PCB to be tested to the probes.

12. The test machine according to claim 9, wherein the high-frequency component is a Central Processing Unit (CPU).

13. The test machine according to claim 9, wherein the high-frequency component is a graphic card.

14. The test machine according to claim 9, wherein the high-frequency component is a Random Access Memory (RAM).

15. The test machine according to claim 9, wherein an electrolytic capacitor to enhance the signals of the high-frequency component is additionally mounted to the connection board.

* * * * *